(12) United States Patent
Otsuka et al.

(10) Patent No.: US 8,305,789 B2
(45) Date of Patent: Nov. 6, 2012

(54) MEMORY/LOGIC CONJUGATE SYSTEM

(76) Inventors: Kanji Otsuka, Higashiyamato (JP);
Tsuneo Ito, Ome (JP); Yoichi Sato,
Iruma (JP); Masahiro Yoshida, Hamura
(JP); Shigeru Yamamoto, Hachioji (JP);
Takeshi Koyama, Ome (JP); **Yuko
Tanba, Ome (JP); Yutaka Akiyama**,
Hachioji (JP)

( * ) Notice: Subject to any disclaimer, the term of this patent is extended or adjusted under 35 U.S.C. 154(b) by 133 days.

(21) Appl. No.: 12/977,243

(22) Filed: Dec. 23, 2010

(65) Prior Publication Data
US 2011/0255323 A1 Oct. 20, 2011

(30) Foreign Application Priority Data
Jul. 2, 2008 (JP) ................................ 2008-173905

(51) Int. Cl.
*G11C 5/06* (2006.01)
(52) U.S. Cl. ........ 365/63; 365/190; 365/129; 365/233.1
(58) Field of Classification Search .................... 365/63, 365/190, 129, 233.1
See application file for complete search history.

(56) References Cited

U.S. PATENT DOCUMENTS

| | | | | |
|---|---|---|---|---|
| 6,347,063 B1 * | 2/2002 | Dosaka et al. | ........... | 365/189.17 |
| 7,295,561 B1 * | 11/2007 | Yao et al. | ...................... | 370/400 |
| 7,652,946 B2 * | 1/2010 | Satoh | ...................... | 365/230.03 |
| 2006/0267213 A1 | 11/2006 | Ozguz et al. | | |
| 2007/0035033 A1 | 2/2007 | Ozguz et al. | | |
| 2009/0154282 A1 | 6/2009 | Satoh | | |

FOREIGN PATENT DOCUMENTS

| | | |
|---|---|---|
| JP | 2007-165589 | 6/2007 |
| JP | 2008-078596 | 4/2008 |
| WO | 2007/060738 | 5/2007 |

OTHER PUBLICATIONS

International Search Report issued Oct. 29, 2009 in International (PCT) Application No. PCT/JP2009/061741.
Kanji Otsuka, "*History and Perspective of System in Package*", InterPack 2007 Keynote, Westin Bayshore Vancouver, Jul. 12, 2007, Vancouver, Canada.
Kanji Otsuka, "*Looking at the Turning Point of Packaging Technology for Communication Systems*", Journal of Japan Institute of Electronics Packaging, Aug. 1, 2007, p. 344-348.

* cited by examiner

*Primary Examiner* — Pho M Luu
(74) *Attorney, Agent, or Firm* — Wenderoth, Lind & Ponack, LLP

(57) ABSTRACT

A bandwidth bottleneck occurs because a crossbar switch is used to cope with an increase in scale. A memory/logic conjugate system according to the present invention, a plurality of cluster memory chips each including a plurality of cluster memories 20 including basic cells 10 arranged in a cluster, the basic cell 10 including a memory circuit, and a controller chip that controls the plurality of cluster memories are three-dimensionally stacked, the plurality of cluster memories 20 located along the stacking direction of the plurality of cluster memory chips and the controller chip are electrically coupled to the controller chip via a multibus 11 including a through-via, an arbitrary one of the basic cells 10 is directly accessed through the multibus 11 from the controller chip so that truth value data is written therein, and whereby the arbitrary basic cell 10 is switched to a logic circuit as conjugate.

20 Claims, 18 Drawing Sheets

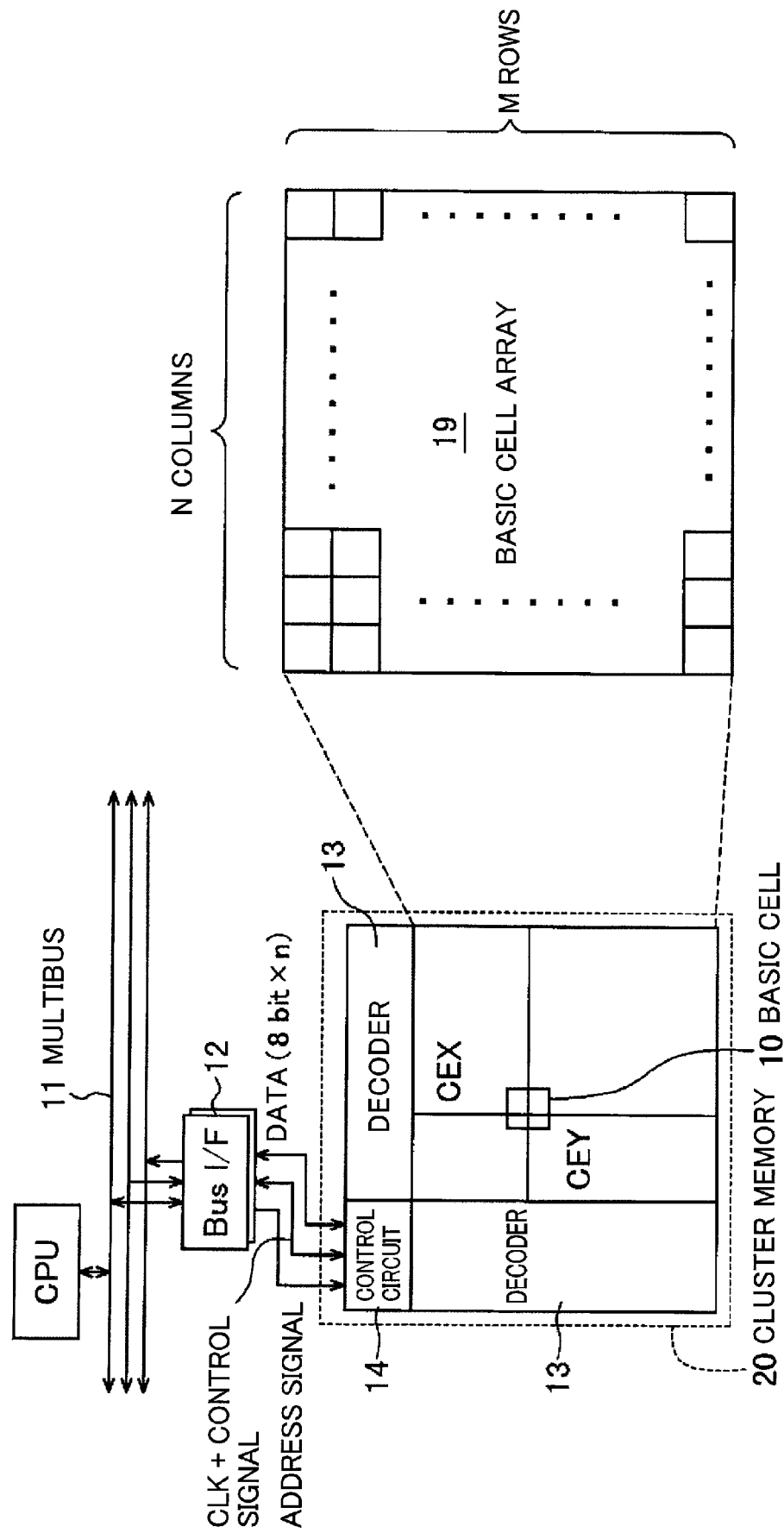

(ADDRESS SPACE OF CLUSTER MEMORY)

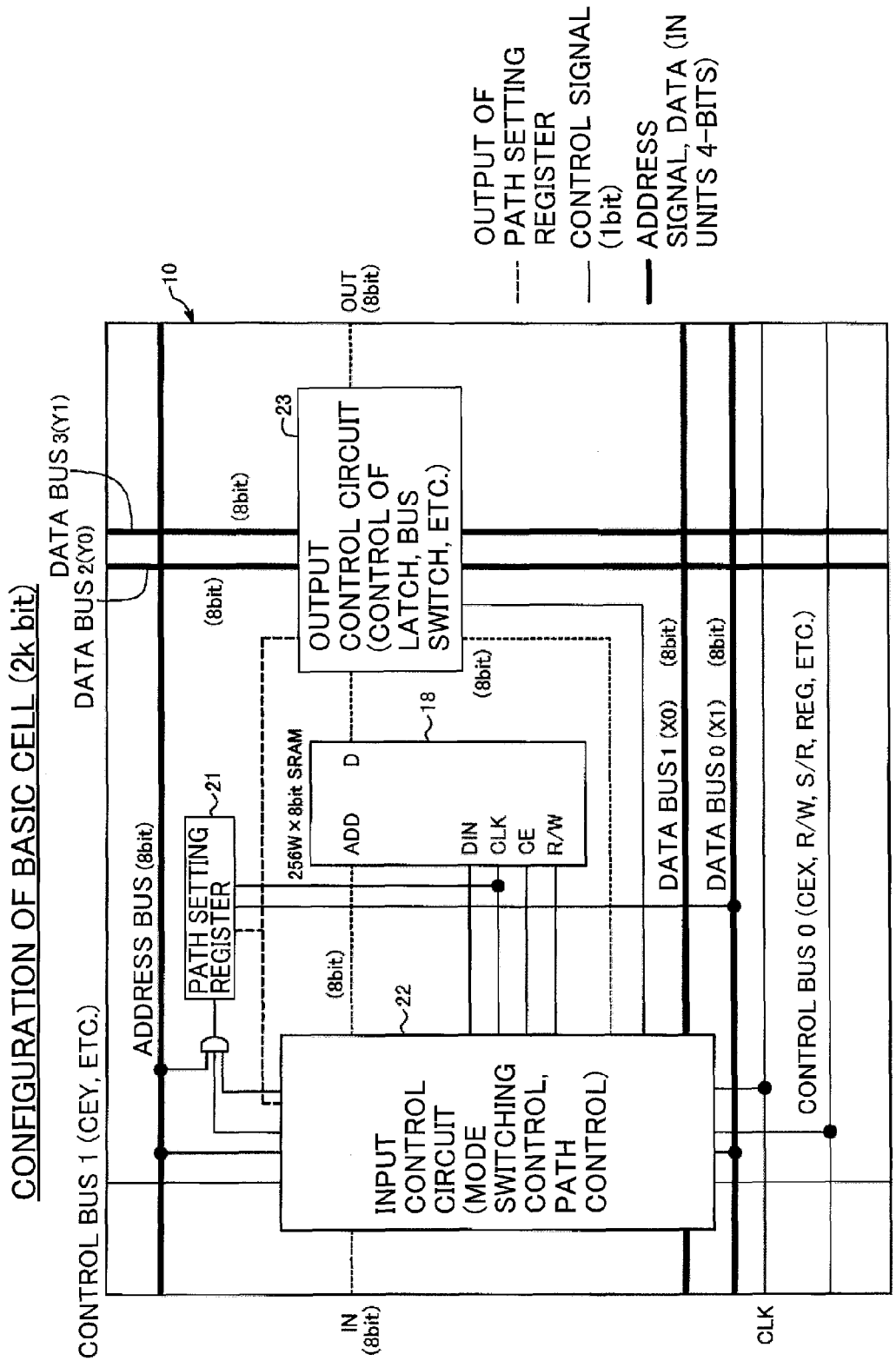

CONCEPTUAL ARRANGEMENT OF BASIC CELL ARRAY

STATE OF INPUT CONTROL CIRCUIT
(FORCED MEMORY MODE)

STATE OF INPUT CONTROL CIRCUIT
(SYSTEM MODE 1)

- COMPUTATION FLOW OF 8-BIT INTEGER
- MULTIPLIER (PIPELINE OPERATION TYPE)

FIG.9 EXEMPLARY CONFIGURATION OF 8-BIT INTEGER MULTIPLIER

3D-SIP STRUCTURE (THREE-DIMENSIONAL SIP STRUCTURE WITH A SINGLE CONTROLLER CHIP AND A PLURALITY OF CLUSTER MEMORY CHIPS)

ENLARGED VIEW (A GLOBAL BUS CONNECTING MAIN CPU AND PU IS ARRANGED ON CONTROLLER CHIP, INTER-CHIP CONNECTING ELECTRODE FORMED THROUGH CHIP THROUGH-VIA IS USED AS LOCAL BUS)

HARDWARE BLOCK DIAGRAM

FIG. 15
APPLICATION EXAMPLE
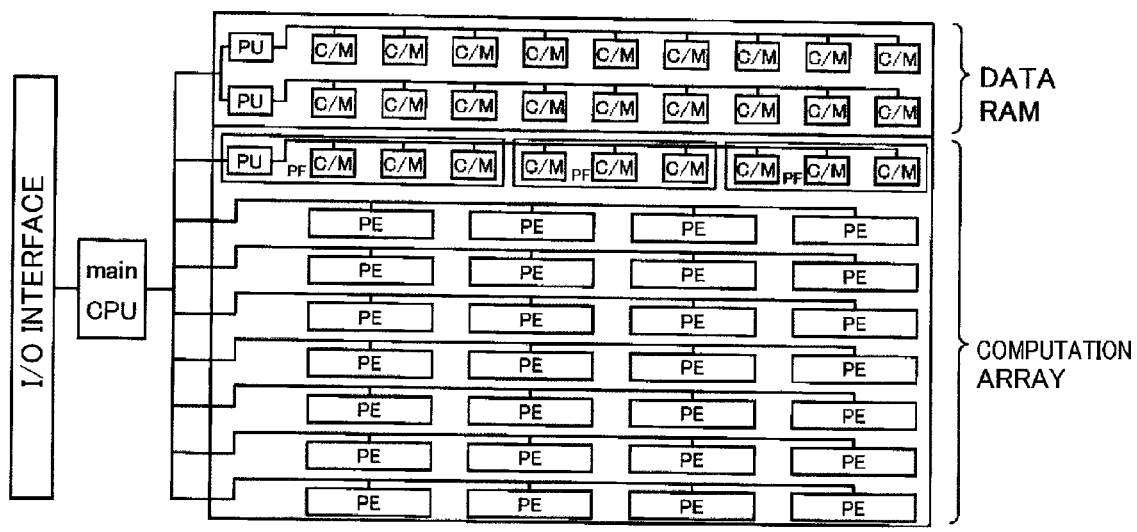
(A) array proccessoer
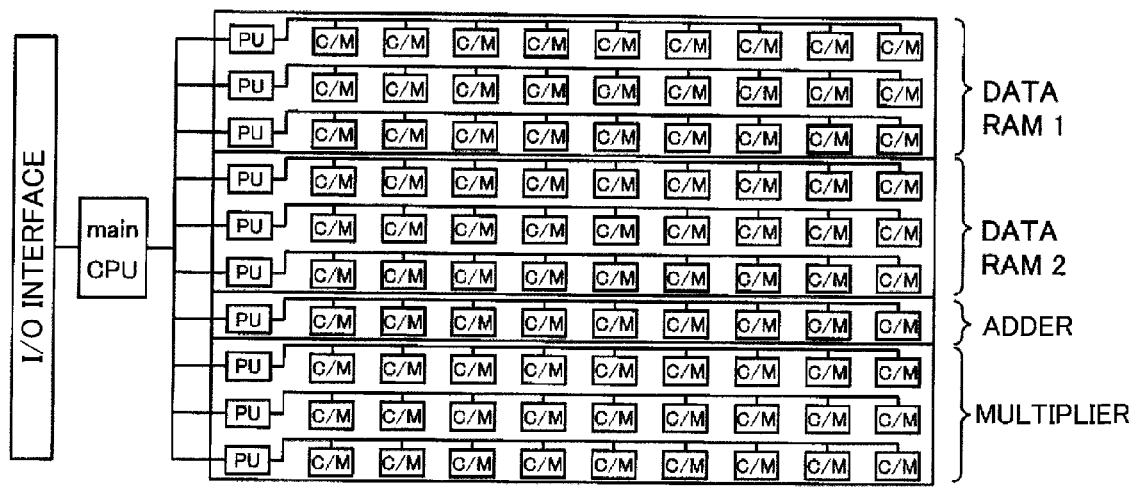
(B) DSP

MEMORY/LOGIC CONJUGATE SYSTEM

BACKGROUND ART

1. Field of the Invention

The present invention relates to a memory/logic conjugate system.

2. Description of a Related Art

In recent years, the complicated architecture of a CPU has been limiting improvement of its performance in comparison with the many number of circuits therein. In addition, the circuits have low flexibility which prevents dynamic reconfiguration according to applications. This may cause the fatal problem of system crashes and therefore a more flexible and robust system is required. FPGA (FIELD PROGRAMMABLE GATE ARRAY) has been playing a part thereof. It can be reconfigured in the field. Although multi-core systems with a collection of simple cores have also been proposed and drawn attentions as a dynamically reconfigurable architecture, their development seems to be limited because a bandwidth bottleneck (bottleneck of the number of wirings) occurs when a crossbar switch is used to cope with an increase in scale. A circuit referred to as a memory, i.e. logic that can save the number of wirings, may be a solution. However, it does not provide a solution because the crossbar switch cannot be omitted for random access between memory mats each including a plurality of memory cells, and the crossbar switch itself is a memory circuit, thus using a large amount of memory.

SUMMARY OF THE INVENTION

With the conventional technology as stated above, there is a problem that a bandwidth bottleneck occurs because a crossbar switch is used to cope with an increase in scale, and there is also a problem that the logic circuit uses a large amount of memory for the crossbar switch.

An example of the technological idea of the present application is a system in which a multibit logic circuit with a multibus configuration is also used as the memory, eliminating the crossbar switch thereby. Accordingly, dynamic reconfiguration becomes possible, thereby enabling mass production using a robust and flexible single circuit and realizing a reduced system cost. Furthermore, the exemplary technological idea of the present application leads to a simplified computer architecture, with which innovation of the entire system can be expected.

As an example of eliminating the crossbar switch, an idea of arranging a number of clustered bus access memories is an example of a gist of the present invention. However, even this requires a large number of connections in the Z-axis direction. Therefore, a new technology is disclosed in which a multibit wiring with a multibus configuration is devised by three-dimensionally stacking chips in combination with a structure that realizes the above-mentioned idea. The new technology can significantly improve the performance in comparison with the conventional art.

In order to solve the above problems, a memory/logic conjugate system according to the present invention comprises a memory circuit including a plurality of memory bits; an internal bus coupled to the memory circuit; a basic cell including the memory circuit and the internal bus; a cluster memory including a plurality of the basic cells arranged in a cluster; a plurality of cluster memory chips each including the cluster memory; a through-via electrically interconnecting the plurality of cluster memory chips in a viewpoint of multilayer; a multibus including the through-via; and a controller that controls the plurality of cluster memories, wherein the controller directly accesses an arbitrary one of the basic cells through the multibus and writes truth value data into the memory circuit via the internal bus, thereby said controller switches the arbitrary basic cell to a logic circuit as conjugate.

According to the memory/logic conjugate system mentioned above, at least a crossbar switch can be eliminated, and an arbitrary basic cell can be switched to a logic circuit or a memory circuit in a pinpoint manner.

The memory/logic conjugate system according to the present invention comprises a plurality of cluster memory chips each comprising a plurality of cluster memories each including a plurality of basic cells arranged in a cluster, each of the basic cells including a memory circuit and an internal bus coupled to the memory circuit; a controller chip that controls the plurality of cluster memories; and a plurality of through-vias electrically coupling the plurality of cluster memory chips and the controller chip in a stacking direction, wherein the plurality of cluster memories included in each of the plurality of cluster memory chips is electrically coupled to the controller chip via a multibus including the plurality of through-vias, and the controller chip directly accesses an arbitrary one of the basic cells through the multibus and writes truth value data via the internal bus, thereby said controller chip switches the arbitrary basic cell to a logic circuit as conjugate.

According to the memory/logic conjugate system mentioned above, at least a crossbar switch can be eliminated, and an arbitrary basic cell can be switched to a logic circuit or a memory circuit in a pinpoint manner.

The memory/logic conjugate system according to the present invention comprises a first cluster memory including a first basic cells arranged in a cluster, each of the first basic cells including a first memory circuit and a first internal bus connected to the first memory circuit; a first bus interface electrically coupled to the first cluster memory; a first cluster memory chip including the first cluster memory and the first bus interface formed therein; a first through-via formed in the first cluster memory chip and electrically coupled to the first bus interface; a second cluster memory including a second basic cells arranged in a cluster, each of the second basic cells including a second memory circuit and a second internal bus coupled to the second memory circuit; a second bus interface electrically coupled to the second cluster memory; a second cluster memory chip including the second cluster memory and the second bus interface formed therein; and a second through-via formed in the second cluster memory chip and electrically coupled to the second bus interface, wherein the first cluster memory chip is stacked on the second cluster memory chip, the first through-via is electrically coupled to the second through-via, an arbitrary one of the first and second basic cells is directly accessed through the first and second through-vias and the first and second bus interfaces so that truth value data is written therein via corresponding the first or second internal buses, and whereby the arbitrary basic cell is switched to a logic circuit as conjugate.

According to the memory/logic conjugate system mentioned above, at least an arbitrary one of the first and second basic cells can be switched to a logic circuit or a memory circuit in a pinpoint manner.

The memory/logic conjugate system according to the present invention comprises a first cluster memory including first basic cells arranged in a cluster, each of the first basic cells including a first memory circuit; a first bus interface electrically coupled to the first cluster memory; a second cluster memory including second basic cells arranged in a cluster, each of the second basic cells including a second memory circuit; a second bus interface electrically coupled to the second cluster memory; a first control circuit that controls the first and second cluster memories; a first local bus electrically interconnecting the first control circuit and the first and second bus interfaces; a third cluster memory including third basic cells arranged in a cluster, each of the third basic cells including a third memory circuit; a third bus interface electrically coupled to the third cluster memory; a fourth cluster memory including fourth basic cells arranged in a cluster, each of the fourth basic cells including a fourth memory circuit; a fourth bus interface electrically coupled to the fourth cluster memory; a second control circuit that controls the third and fourth cluster memories; a second local bus electrically interconnecting the second control circuit and the third and fourth bus interfaces; a global bus electrically coupling the first control circuit and the second control circuit; and a central control circuit electrically coupled to the global bus to control and manage the first to fourth cluster memories as a whole, wherein an arbitrary one of the first to fourth basic cells is directly accessed through the first local bus or the second local bus so that truth value data is written therein, and whereby the arbitrary basic cell is switched to a logic circuit as conjugate.

BRIEF DESCRIPTION OF THE DRAWINGS

FIG. 1A is a schematic diagram illustrating a basic configuration of a cluster memory according to an embodiment of the present invention;

FIG. 2 is an explanatory diagram of the configuration and general function of the basic cell shown in FIGS. 1A and 1B;

FIGS. 15A and 15B illustrate a configuration of a part of an application example of the memory/logic conjugate system shown in FIG. 14;

DESCRIPTION OF THE PREFERRED EMBODIMENTS

Figure 1B:
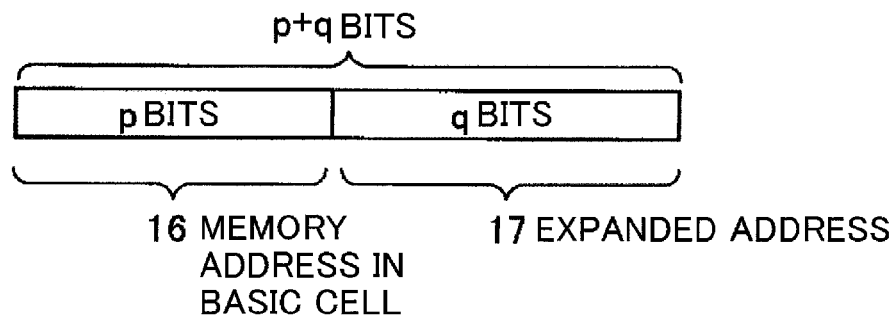
FIG. 1B is a schematic diagram illustrating an address space of a cluster memory according to an embodiment of the present invention.

Embodiments of the present invention will be described below, referring to the drawings.

An embodiment of the present invention is an LSI and its configuration or architecture having a plurality of basic cells arranged in a cluster, the basic cell having a memory circuit composed of a plurality of memory bits, with a function that can switch the basic cell to a logic circuit by controlling an address of the basic cell. The main object of the present invention is to realize an architecture capable of dynamically reconfiguring the basic cell into a variety of modes according to a job request. In the present embodiment, the modes include a forced memory mode (A) and a system mode (B). The forced memory mode (A) includes an external memory mode (A-1) (normal memory) and a path setting register write mode (A-2). The system mode (B) includes a memory mode (B-1) and a logic mode (B-2). The memory mode (B-1) includes an external memory mode (B-1-1) (normal memory) and a path setting register write mode (B-1-2). The logic mode (B-2) includes a computation mode (B-2-1), a combined circuit mode (B-2-2), an internal memory mode (B-2-3) (memory invisible from outside), a logic Lib mode (B-2-4), and a path setting register information modification mode (B-2-5). The system is named a memory/logic conjugate system. A multibit and multibus connection as well as a multibit decoder are required to realize it. This is realized by a three-dimensional system-in-package (3D-SIP) structure.

An example of the configuration having basic cells arranged in a cluster, the basic cell having a memory circuit (i.e., cluster memory) is an n-row×m-column array of basic cells including a memory circuit (e.g., SRAM) composed of a plurality of memory bits, for example 256 words×8 bits. The memory/logic conjugate system thus provides an array configuration and three dimensional interconnection capable of intercommunication in a range without wiring delay or signal degradation, with a multilayer structure in which a plurality of chips (cluster memory chips) each having a plurality of such cluster memories formed therein is further stacked, and a through silicon via is formed in each cluster memory chip so that a plurality of cluster memory chips is interconnected by the through silicon vias.

Before describing the entire configuration of the memory/logic conjugate system, description of the configuration of the cluster memory, which is formed in plural number in each of a plurality of cluster memory chips will be provided below.

As shown in FIGS. 1A and 1B, the basic configuration of a cluster memory 20 has a relatively small, such as 256 words×8 bits, SRAM-based basic cell 10, for example, arranged in an n-row×m-column array. The basic cell 10 can be operated as a logic circuit by writing truth value data into the SRAM. With a configuration allowing direct access to the basic cell 10 from the CPU via a multibus 11 (comprising a through silicon via) shown in FIGS. 1A and 1B and a Bus I/F (bus interface) 12 (formed on the cluster memory chip), an arbitrary one of the plurality of basic cells can be switched as a logic circuit or a memory circuit (e.g., SRAM) in a pinpoint manner (allowing dynamic reconfiguration). In addition, the cluster memory 20, whose operation speed can be easily increased because a relatively small memory circuit is used for the basic cell, can be treated as a high-speed logic block.

Specifically, the memory/logic conjugate system according to the embodiment comprises, as shown in FIG. 1A, a basic cell array 19 having the basic cells 10 arranged in an n-row×m-column array, each basic cell having a memory circuit; a decoder 13 electrically connected to each of the basic cells 10; a control circuit 14; a bus interface 12 electrically connected to each of the decoder 13 and the control circuit 14; and a multibus 11 electrically connected to the bus interface 12. As shown in FIG. 1B, the address space of the cluster memory 20 having the basic cell array 19 is expressed by a memory address 16 in a basic cell and an expanded address (generation of CEX and CEY) 17. An address signal, a clock signal (CLK), and a control signal from the bus interface 12 are configured to be input to the control circuit 14 of FIG. 1A.

Although an SRAM (Static Random Access Memory) is used as the basic cell of the memory circuit in this embodiment, the SRAM may be replaced by a DRAM (Dynamic Random Access Memory) or an NVM (Non Volatile Memory) each having a control mechanism. However, an SRAM circuit is assumed in the following description for a more specific explanation.

Next, the configuration and general function of the basic cell 10, which is the core of the cluster memory 20, will be described referring to FIG. 2.

As shown in FIG. 2, the basic cell 10 includes the following three functional parts in a broad sense.

i. an SRAM 18 (memory circuit including 256 words×8 bits), ii. a plurality of types of internal buses (address bus, data buses 0 to 3, control buses 0 and 1, and clocks CLK and IN) included in the basic cell 10 and relating to SRAM 18, iii. a path setting unit which connects the SRAM and an internal bus of the basic cell 10 (an input control circuit 22 and an output control circuit 23 (including a switch), and a path setting register 21 that controls the input control circuit 22 and the output control circuit 23).

Specifically, as shown in FIG. 2, the basic cell 10 has the SRAM 18 including 256 words×8 bits, the input control circuit 22 that performs mode switching control and path control, the output control circuit 23 including a latch, a bus switch, a register, and a logic circuit that controls them, and the path setting register 21 that performs connection (path setting) of the internal buses of the basic cell by controlling the input control circuit 22 and the output control circuit 23. The SRAM 18 and the input control circuit 22 are electrically connected to each other, and the SRAM 18 and the output control circuit 23 are electrically connected to each other. The internal bus included in the basic cell 10 is configured using a wiring layer of the cluster memory chip and has an address bus (8 bits), a control bus 0 (CEX, R/W, S/R, REG, etc.), a control bus 1 (CEY etc.), a data bus 0 (X1 (8 bits)), a data bus 1 (X0 (8 bits)), a data bus 2 (Y0 (8 bits)), and a data bus 3 (Y1 (8 bits)). Although a limited number of data buses and address bused are described here for ease of explanation, it is not limited thereto. The number of buses may be increased or decreased, or they may be multiplexed according to the configuration of the basic cell, facilitating dynamic reconfiguration thereby.

Using the basic cell 10 as a logic circuit is realized by writing truth value data of the logic circuit in the SRAM 18 composed of a plurality of memory bits and reading the truth value data stored in the SRAM 18, with the input value to the logic circuit being used as an address signal. The path of inputting/outputting signals to and from the SRAM 18 can be specified with the path setting register 21 and a bus switch 23 of the path setting unit. The content of the path setting register 21 and the bus switch 23 can be directly rewritten from the multibus 11 (including a through silicon via) outside the cluster memory 20 via an internal bus included in the basic cell, by mapping the path setting register 21 and the bus switch 23 to an address different from that of the SRAM 18. A desired logic circuit is realized by increasing the connection between a plurality of basic cells 10 according to the scale of logic. A system can be constructed which operates many basic cells 10 in parallel efficiently in cooperation with each other by appropriately selecting the scale of the array of cluster memories 20 and the number of cluster memories 20 connected to the multibus 11. By mapping a plurality of basic cells in the cluster memory 20 to an address space in units of basic cells respectively, the cluster memory 20 can be dynamically reconfigured in units of basic cells in a pinpoint manner. Using this function, it is possible to construct a system which detours a defect site, a system provided with a learning function, or a highly reliable system provided with redundancy.

Figure 3:
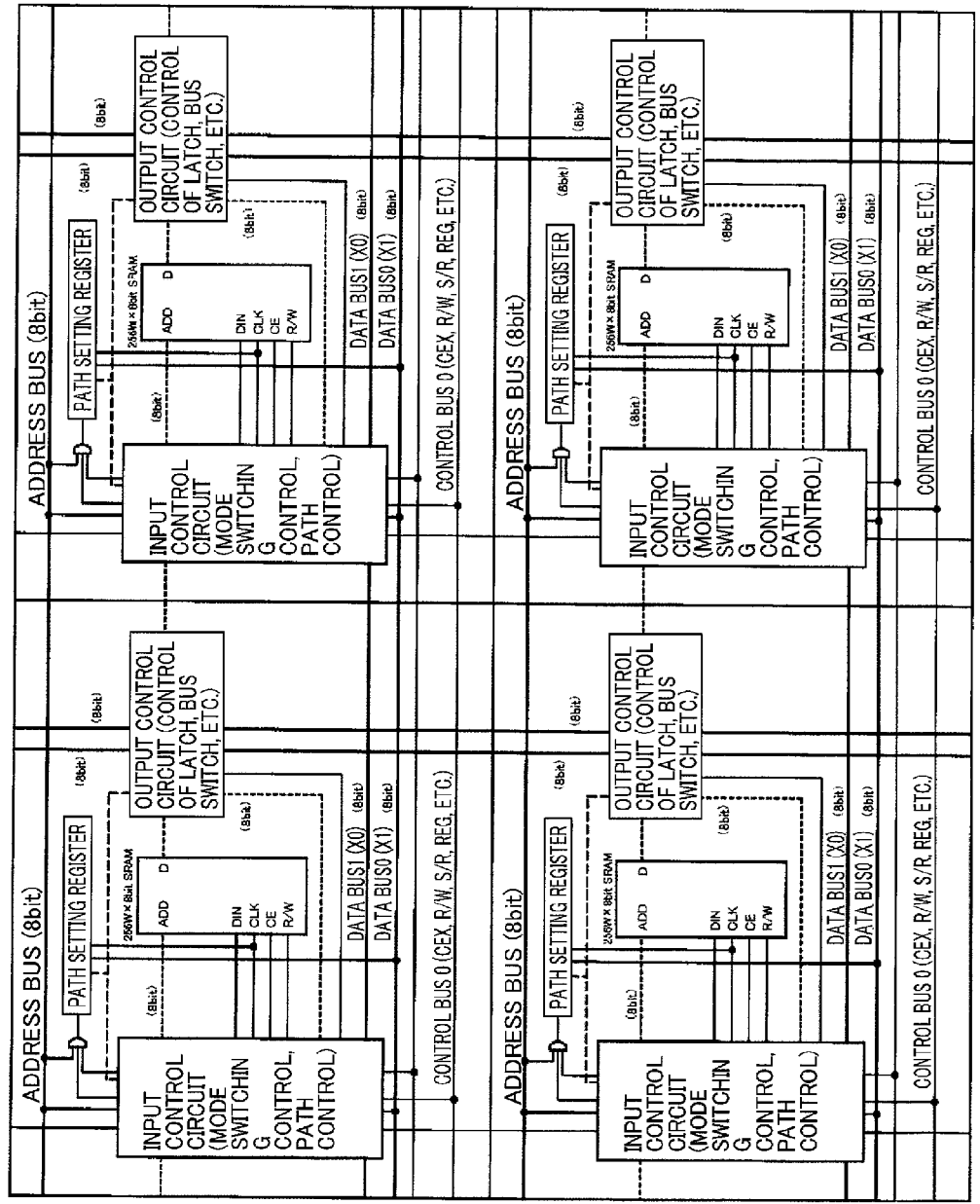
FIG. 3 illustrates a conceptual arrangement of the basic cells shown in FIGS. 1A and 1B.

FIG. 3 illustrates a conceptual arrangement of the basic cells 10 in the basic cell array 19.

Next, an operation specification (mode setting) of the basic cell 10 will be described, referring to FIGS. 4 to 6.

Figure 4:
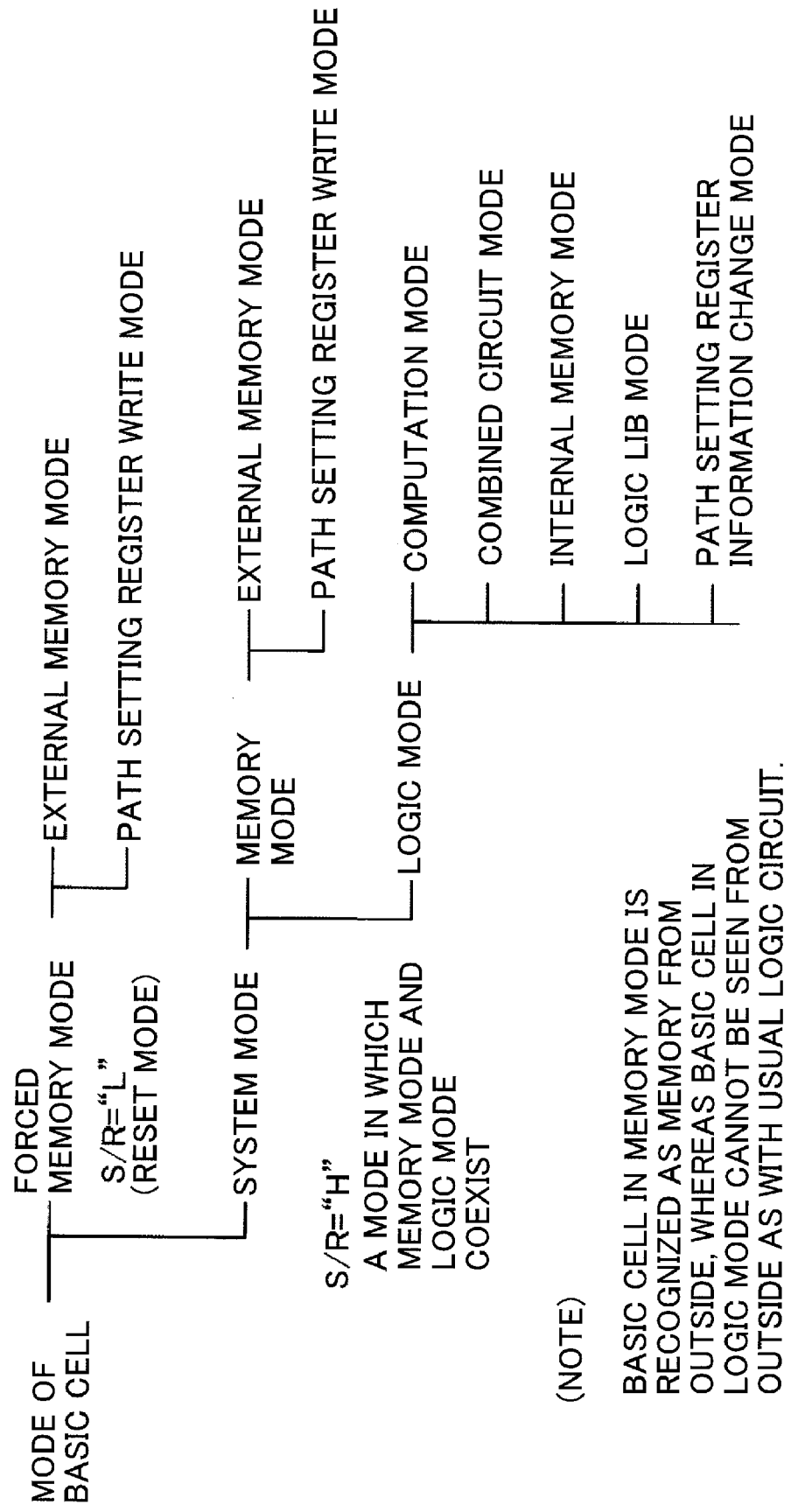
FIG. 4 illustrates a mode hierarchy of the basic cell shown in FIGS. 1A and 1B.

FIG. 4 illustrates a mode hierarchy of the basic cell 10.

(1) An S/R (Set/Reset) signal (in a broad sense, a first control signal) of the control bus 0 is a forced reset signal. The basic cell enters a forced memory mode (A) when the S/R signal is at "L" level (in a broad sense, a first level), or a system mode (B) when the SIR signal is at "H" level (in a broad sense, a second level). In the forced memory mode (A), the logic mode (B-2) can be turned into a reset state. Except for an initial setting of the basic cell array 19, the S/R signal is always used at "H" level. As mentioned above, the forced memory mode (A) includes the external memory mode (A-1) and the path setting register write mode (A-2). The system mode (B) includes the memory mode (B-1) and the logic mode (B-2). The memory mode (B-1) includes the external memory mode (B-1-1) and the path setting register write mode (B-1-2). The logic mode (B-2) includes the computation mode (B-2-1), the combined circuit mode (B-2-2), the internal memory mode (B-2-3), the logic Lib mode (B-2-4), and the path setting register information change mode (B-2-5).

Figure 5:
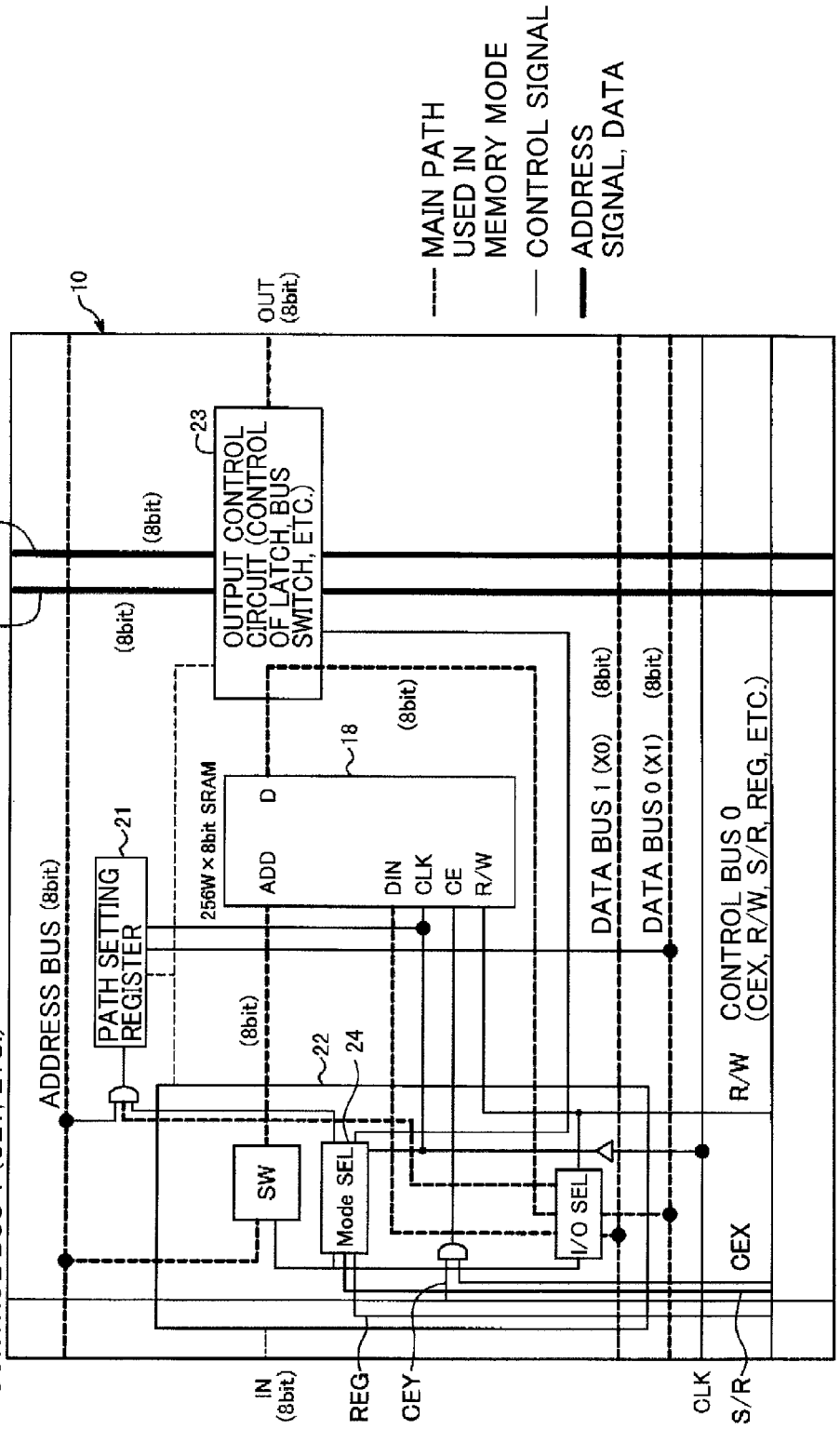
FIG. 5 illustrates the internal state in a forced memory mode of the basic cell shown in FIGS. 1A and 1B.

FIG. 5 illustrates the internal state of the input control circuit 22 in the forced memory mode (A).

Figure 6:
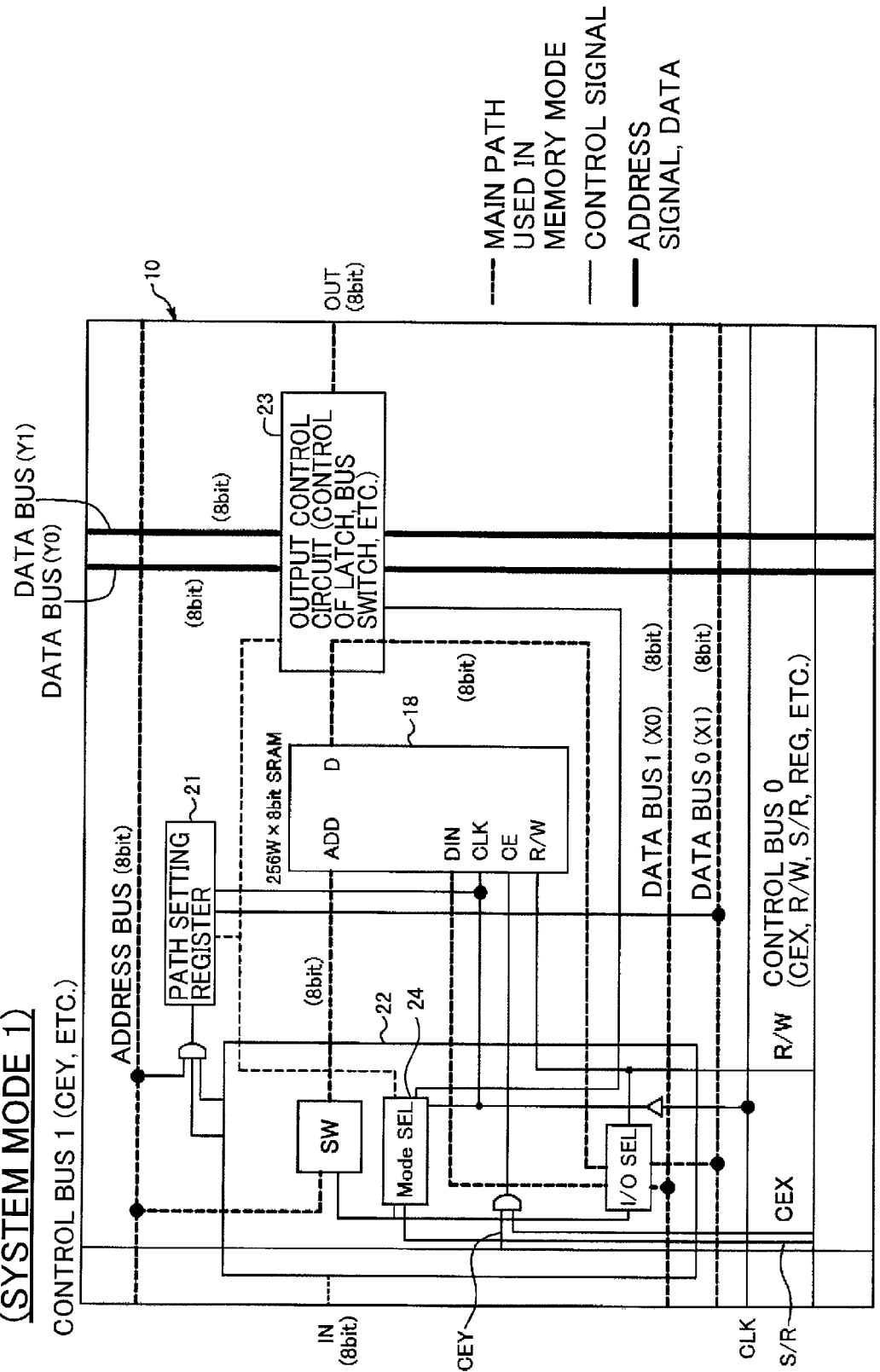
FIG. 6 illustrates the internal state in an external memory mode (B-1-1) of the basic cell shown in FIGS. 1A and 1B.

FIG. 6 illustrates the internal state of the input control circuit 22 in the external memory mode (B-1-1).

Figure 7:
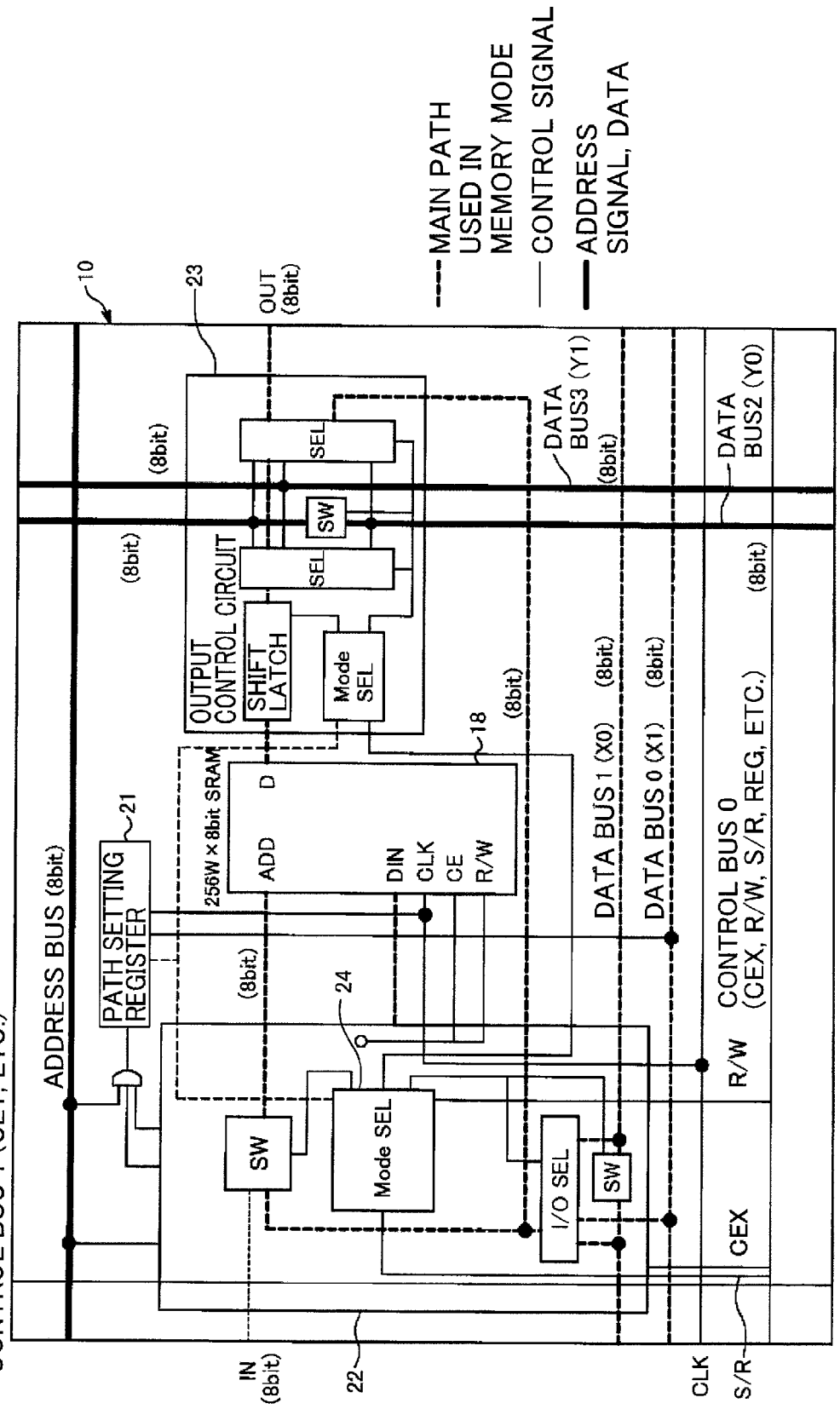
FIG. 7 illustrates the internal state in a computation mode (B-2-1) of the basic cell shown in FIGS. 1A and 1B.

FIG. 7 illustrates the internal state of the input control circuit 22 and the output control circuit 23 in the computation mode (B-2-1).

(2) Setting of each mode of the basic cell 10 is performed according to the content of the path setting register 21 and flag information of a mode selector 24 in the input control circuit 22 and the mode selector 24 in the output control circuit 23. It is also possible to facilitate dynamic reconfiguration by assigning one of the path setting registers that is related to mode switching to some of the multiplexed address buses and data buses in a dedicated manner.

(3) The content of the path setting register 21 can be rewritten in the memory mode (B-2) in units of eight bits and in units of specified basic cells in a pinpoint manner.

(4) There is a priority relation between information of the path setting register 21 and flag information of the mode selector 24, the flag information of the mode selector 24 having a higher priority than the information of the path setting register 21. Accordingly, a part of the function specified by the information of the path setting register 21 can be stopped or resumed based on the flag information of the mode selector 24.

(5) The flag information of the mode selector 24 can be rewritten by the logic processing result of the decoder 13 (FIG. 1A) managing the basic cell array 19, or of the basic cell 10.

Description of the operation of the present invention, which is a new concept, can be supplemented as follows.

(1) Input Control Circuit 22

(A) To be switched to the forced memory mode (A) when the S/R (Set/Reset) signal of the control bus 0 is "LOW" (="0"), and to the system mode (B) when "HIGH" (="1").

(B) An address signal (upper ADD: ADDRESS, lower ADD: ADDRESS), a data input signal (upper DATA, lower DATA), and a control signal (R/W: read/write, CE: column enable) are input from the internal bus of the basic cell 10 to an input terminal of the SRAM 18 selected at CEX and CEY of the control bus 0 and the control bus 1 in the memory mode (B-1), and whereby the SRAM 18 in the basic cell array 19 becomes directly controllable from the multibus 11.

(C) In the logic mode (B-2), the address signal, data input signal, and control signal in the memory mode (B-1) are blocked to go under control of the path setting register 21

(D) There are the following five modes as the logic mode (B-2) that operates under control of the path setting register 21.

(B-2-1) Computation mode,
(B-2-2) Combined circuit mode,
(B-2-3) Internal memory mode (memory invisible from outside),
(B-2-4) Logic Lib mode,
(B-2-5) Path setting register information change mode (2) Feedback Switch (A) It can be used in the logic mode (B-2).

(B) It is a SW that outputs an output signal of the SRAM 18 to the address terminal of the SRAM 18.

(C) It can be turned ON/OF in units of upper/lower four bits, and exchange of upper and lower bits can also be specified.

In this case, either the output of the feedback SW or IN0/IN1 is turned ON.

(3) Output Control Circuit 23

The output control circuit 23, including a latch, a bus switch, a register, a logic circuit, and a circuit that controls them, performs switching of the OUT signal connecting the basic cell arrays 19 (FIG. 1A) in a cascaded manner, and the outputs to the data bus 2 and the data bus 3 connecting the basic cells 10 in parallel.

Next, an example of realizing an 8-bit integer multiplier using a plurality of the cluster memories 20 in the present embodiment will be described.

In the memory/logic conjugate system, the configuration of which will be described in detail below, a plurality of chips (cluster memory chips) each having a plurality of cluster memories 20 formed therein is further stacked to form a multilayer structure, and a through silicon via is formed in each cluster memory chip so that a plurality of cluster memory chips is interconnected by the through silicon vias. A plurality of cluster memories located in the stacking direction (referred to as "Z-direction" in the following) of the cluster memory chips and interconnected by through silicon vias constitutes a single group. The 8-bit integer multiplier can be realized using the group.

Figure 8:
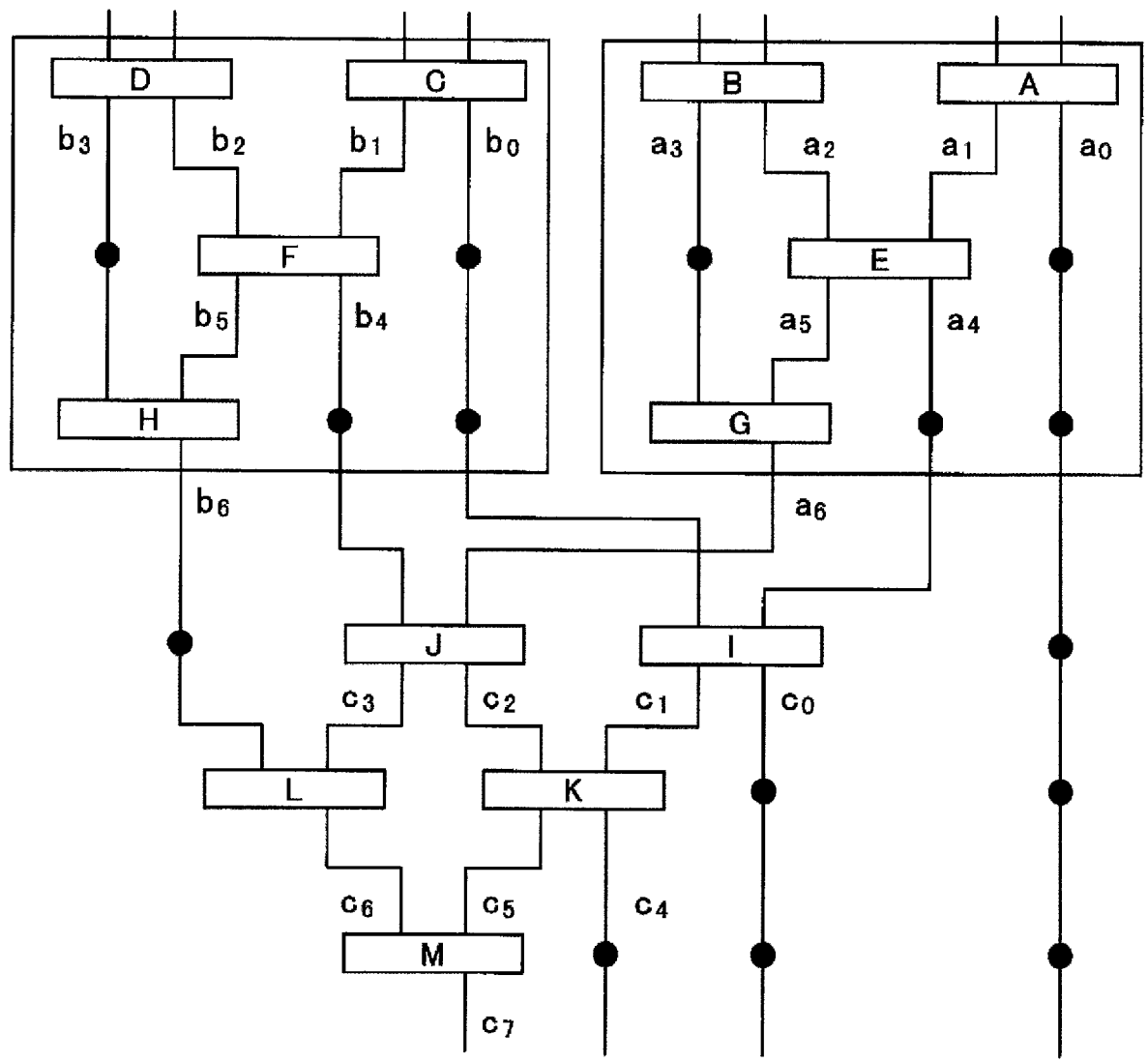
FIG. 8 illustrates a computation flow of an 8-bit integer multiplier (pipeline operation type)
Figure 9:
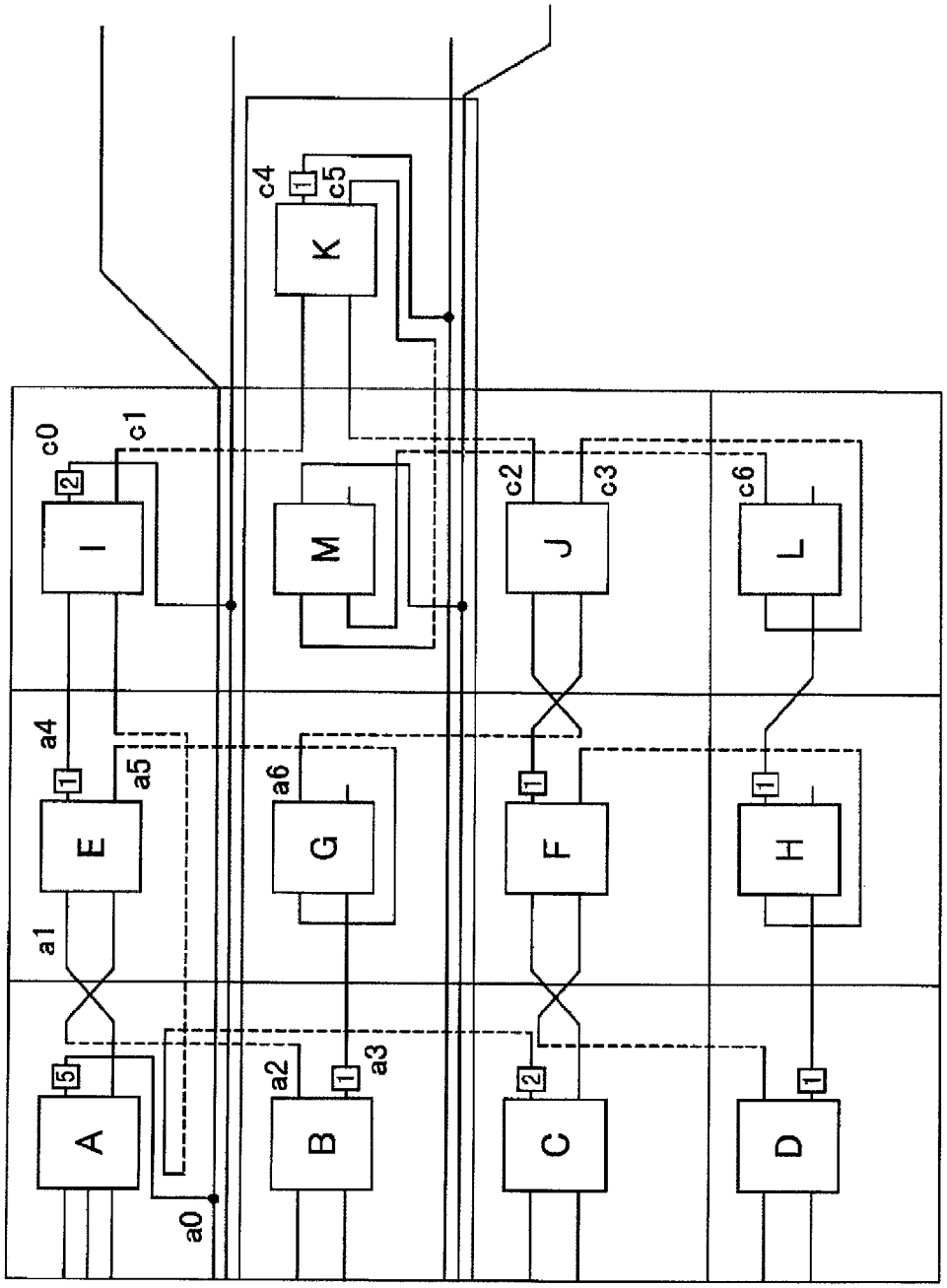
FIG. 9 illustrates an exemplary configuration of the 8-bit integer multiplier.

FIG. 8 illustrates an exemplary computation flow of an 8-bit integer multiplier (pipeline operation type), and FIG. 9 illustrates an exemplary configuration of the 8-bit integer multiplier. As shown in FIGS. 8 and 9, the 8-bit integer multiplier (pipeline operation type) can be realized by thirteen computation circuits A to M each having two 4-bit inputs and an 8-bit output. The black circles shown in FIG. 8 are registers for adjusting the timing of the computation result using a synchronous SRAM, and are equivalent to the shift latch included in the output control circuit 23 of FIG. 7. The shift latch is usually composed of a register and a switch, the register also being usable as a data register. How the register and the switch are used is specified by the path setting register.

On the other hand, the cluster memory 20 (FIG. 1A) can be used as a computation circuit having a 4-bit input and an 8-bit output, by preliminarily writing truth value data into the SRAM 18, applying one of the 4-bit input data to the upper 4 bits of the 8-bit address bus and applying the other 4-bit input data to the lower 4 bits.

The 8-bit integer multiplier can be realized by using the thirteen cluster memories 20 belonging to one group and being interconnected by through silicon vias as the computation circuits A to M shown in FIGS. 8 and 9. Since the calculation between L and M in FIG. 8 is performed between carries, it is possible to reduce the basic cells L and M of this part by using a simple logic circuit (e.g., logical sum OR) mounted on the output control circuit 23. As for the number of through silicon vias required for a basic cell, a minimum of two units are sufficient to realize a basic cell, with four bits as a unit, and a substantially complicated circuit can be constructed by providing four units. Furthermore, it is advantageous for realizing a high-speed circuit since the through silicon vias can shorten the connection path between the basic cells.

Next, address mapping of the cluster memory 20 will be described.

Figure 10:
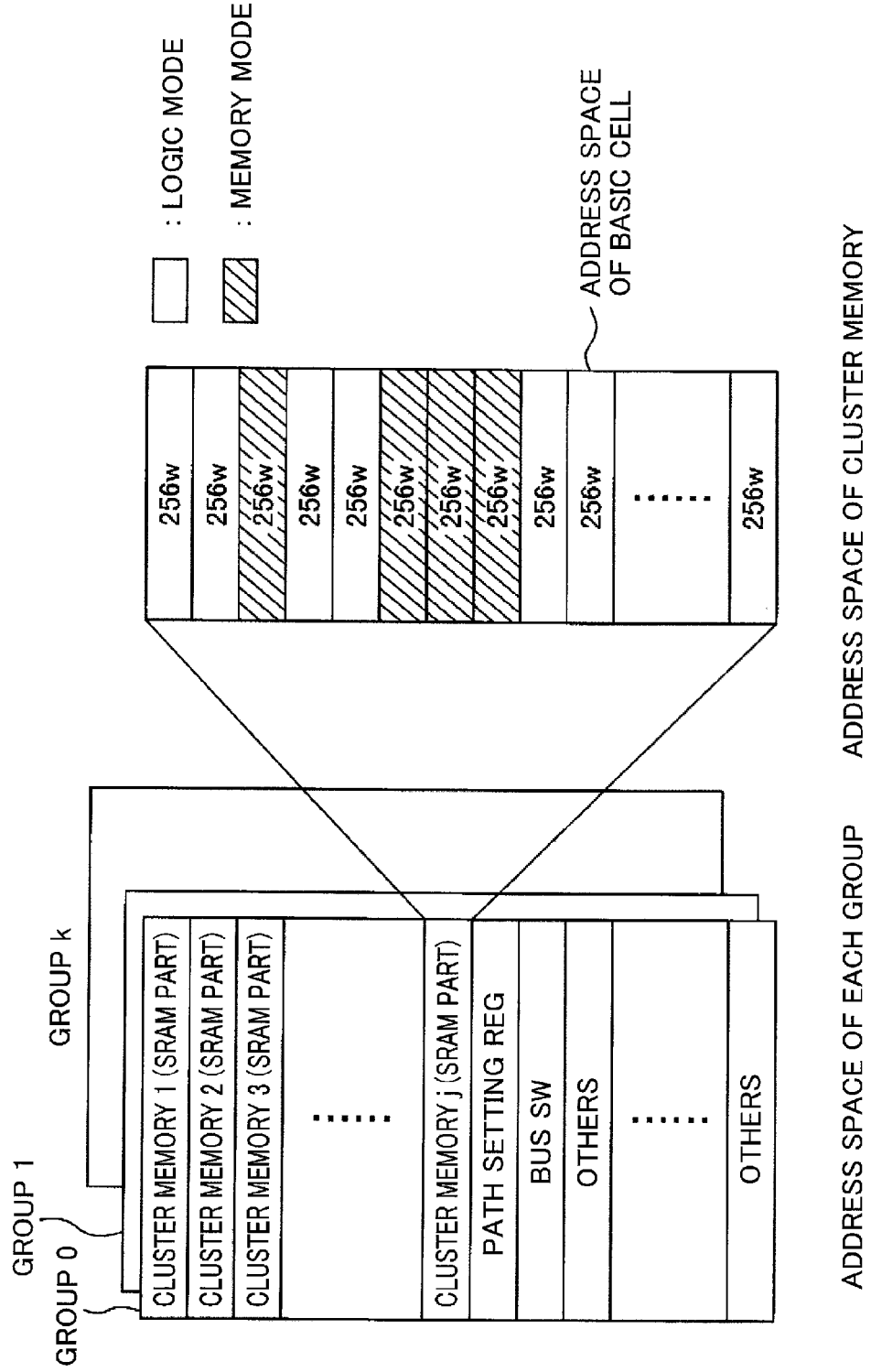
FIG. 10 illustrates an address space of a memory/logic conjugate system according to an embodiment of the present invention.

FIG. 10 illustrates an exemplary address mapping of the cluster memory.

In the memory/logic conjugate system, the configuration of which will be described in detail below, a plurality of chips (cluster memory chips) each having a plurality of cluster memories 20 formed therein is further stacked to form a multilayer structure, and a through silicon via is formed in each cluster memory chip so that a plurality of cluster memory chips is interconnected by the through silicon vias. A plurality of cluster memories located in the stacking direction (referred to as "Z-direction" in the following) of the cluster memory chips and interconnected by through silicon vias constitutes a single group. A plurality of basic cells, a plurality of path setting registers, and a plurality of bus switches in a plurality of cluster memories constituting such a group are respectively mapped on the address space in units of groups.

As mentioned above, the content of the path setting register 21 and the bus switch can be directly rewritten from the multibus 11 (including a through silicon via) outside the cluster memory 20 via the internal bus of the basic cell 10 by mapping the path setting register 21 and the bus switch to an address other than that of the SRAM 18.

The entire configuration of the memory/logic conjugate system will be described next.

Figure 11:
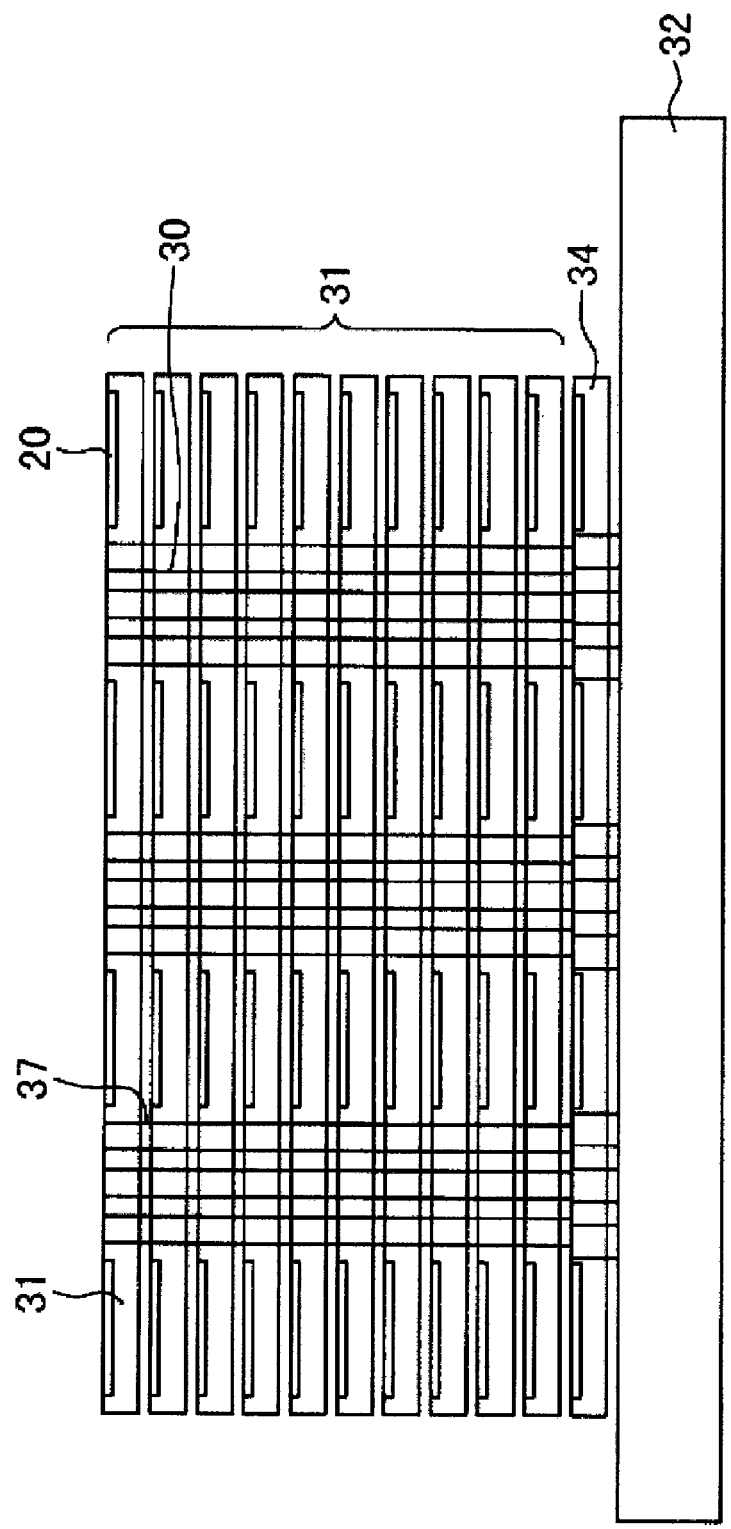
FIG. 11 is a cross-sectional view schematically illustrating the memory/logic conjugate system according to an embodiment of the present invention.

The memory/logic conjugate system shown in FIG. 11 has a wiring substrate 32, a controller chip 34 is stacked on the wiring substrate 32, and further a plurality of cluster memory chips 31 is stacked (for about 10 layers) on the controller chip 34. The chips 31 and 34 are electrically interconnected by a through silicon via (TSV) 30 and an interconnection pad (not shown).

As means that can provide one-to-one tight-coupling between clusters (between cluster memories) randomly via a multibus, there is a three-dimensional system-in-package (3D-SiP) structure using a through silicon via (TSV), and a combination of the means can establish the superiority of the system and the architecture. The degree of integration can be further enhanced by miniaturizing the process node, allowing future evolution and assuring more-than-sufficient competitiveness against the multi-core based current trend.

Figure 12:
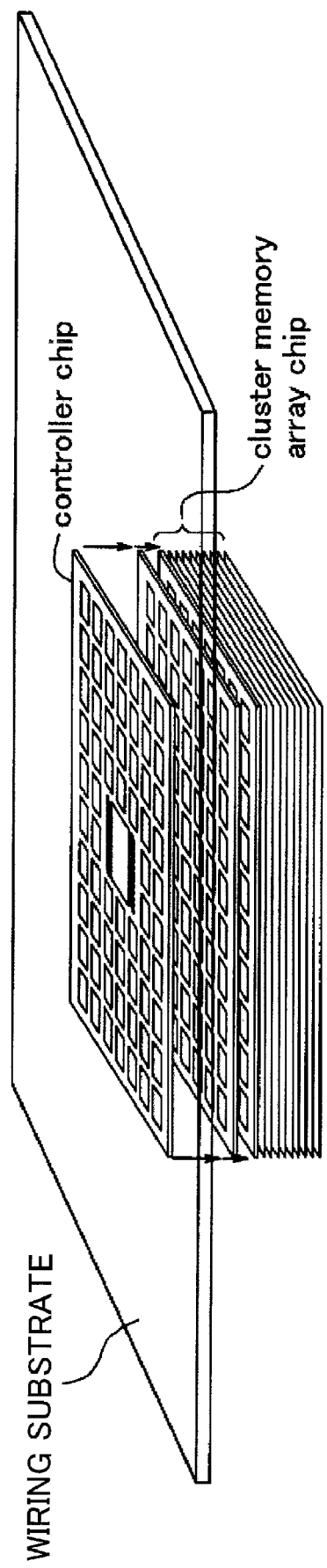
FIG. 12 is a schematic diagram in which the memory/logic conjugate system according to an embodiment of the present invention is realized with a three-dimensional system-in-package (3D-SIP) structure.
Figure 13:
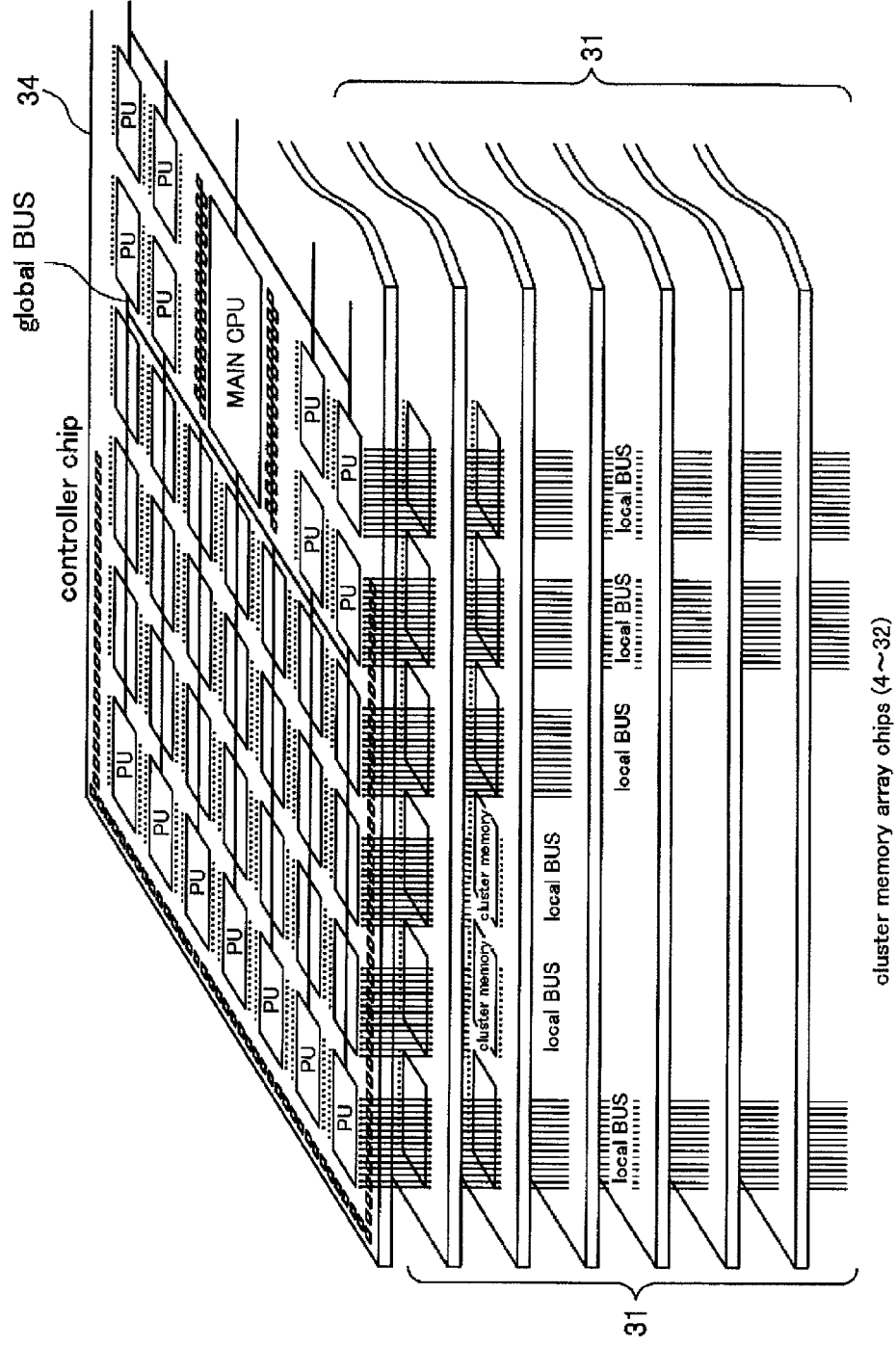
FIG. 13 is an enlarged view of the three-dimensional system-in-package structure shown in FIG. 12.
Figure 14:
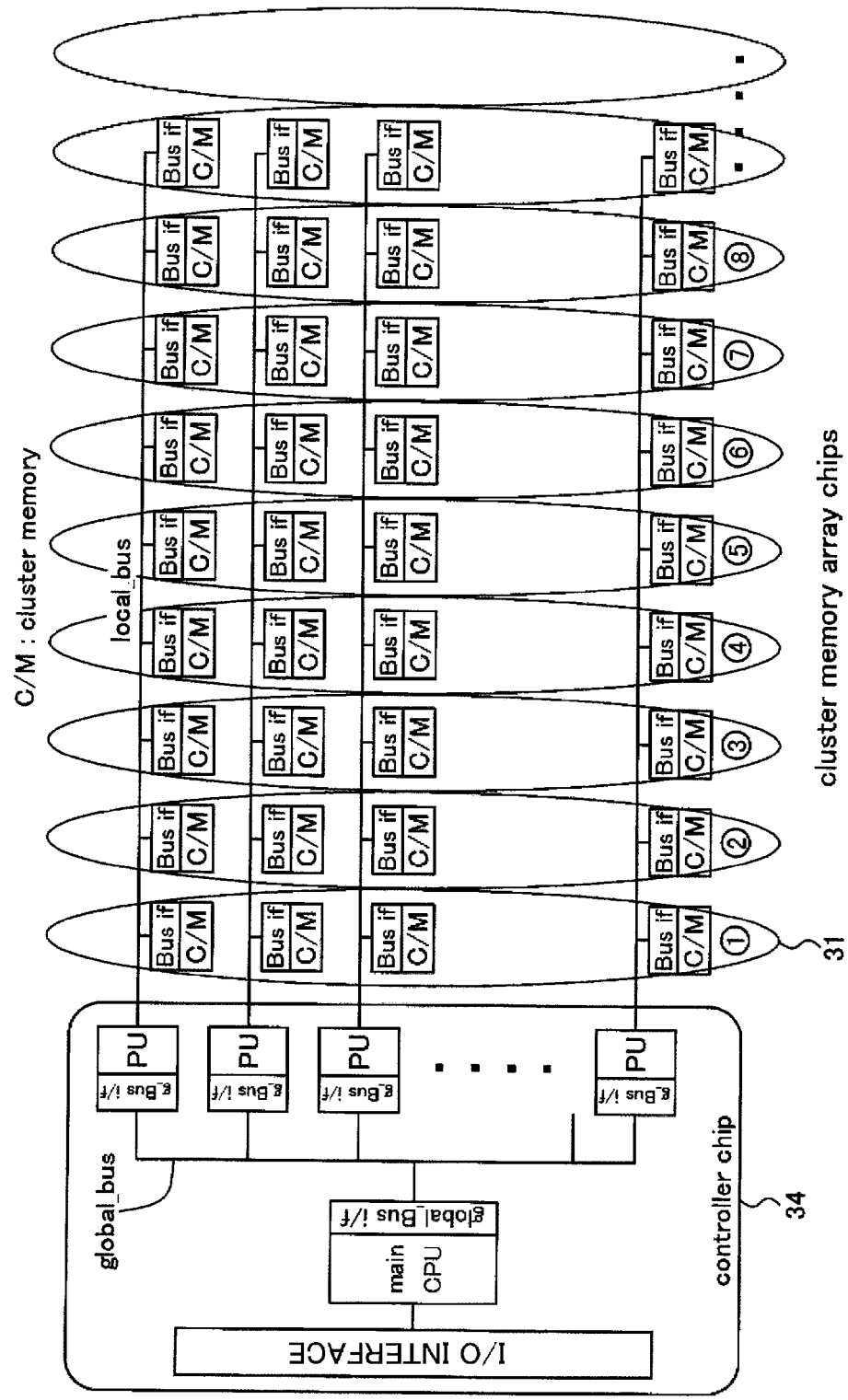
FIG. 14 is a block diagram illustrating hardware of the memory/logic conjugate system according to an embodiment of the present invention.

FIGS. 12 to 14 illustrate a system configuration when specifically realizing the configuration shown in FIG. 11 with a CMOS (Complementary Metal Oxide Semiconductor) structure. When forming a large number of cluster memories in practice, it is unrealistic to connect all the memories to a single Multi Bus, which may lead to degradation of the performance in a viewpoint of bus load. As a countermeasure, as shown in FIG. 14, the controller chip is divided into a central control circuit (main CPU) for controlling and managing the entire system, and a plurality of control circuits (sub CPUs (PU; processing unit)), each control circuit (PU) having several to dozens of cluster memories (C/M: corresponding to the cluster memories 20 shown in FIG. 1A) constituting a single group connected thereto, so that each cluster memory (individual basic cell) is controlled by the control circuit (PU) to which it is connected. In FIG. 14, a local Bus includes a through silicon via. In addition, an array of the central control circuit (main CPU) and the control circuits (sub CPUs) are formed on a single chip (corresponding to the controller chip 34 shown in FIG. 11) and coupled by a global BUS planarly arranged in the controller chip 34. The central control circuit (main CPU) may be provided outside the controller chip 34, not on the controller chip 34, and may be electrically connected to the controller chip 34 via the wiring substrate 32.

As shown in FIGS. 12 and 13, the cluster memory chip 31 having only a cluster memory disposed on a single chip is formed, and a single controller chip 34 and a plurality of cluster memory chips 31 are stacked so that the PU and the cluster memories are connected by through silicon vias. FIG. 12 is a schematic diagram realizing the memory/logic conjugate system with a three-dimensional system-in-package (3D-SIP) structure having the single controller chip 34 and the plurality of cluster memory chips 31 stacked therein. FIG. 13 is an enlarged view of the three-dimensional system-in-package (3D-SIP) structure shown in FIG. 12, illustrating a configuration in which a global bus connecting the main CPU and the sub CPU using a wiring layer on the controller chip 34 is arranged, and the connection electrode between the chips formed through the through silicon via is used as a local bus (Z-address select line). The global bus and the local bus mentioned here are equivalent to the multibus 11 shown in FIG. 1A.

As shown in FIG. 14, a plurality of cluster memory chips 31 having a plurality of cluster memories arranged therein is stacked, and the cluster memories in each of the plurality of cluster memory chips 31 are electrically interconnected by a local bus (e.g., a through silicon via). A plurality of such local buses is provided, each of the local buses being connected to the PU respectively. Each PU is connected to a global bus interface, which is connected to a global bus. The main CPU is connected to the global bus via a global bus interface.

The CPU system and the global Bus which generate a large amount of heat due to the above-mentioned structure can be integrated in a single chip (the controller chip 34) and located at a site having the minimum heat resistance (side of the wiring substrate 32 or the heat sink). Since each PU can operate independently, it also becomes possible to realize parallel computation and pipeline operation by appropriately distributing clock signals.

FIG. 15(A) illustrates the configuration of a part of an application example of the memory/logic conjugate system shown in FIG. 14, and FIG. 15(B) illustrates the configuration of another application example of the memory/logic conjugate system shown in FIG. 14.

As shown in FIG. 15(A), an array processor having a DATA RAM including a C/M (control memory) and a computing array including a PE (processor element) can be realized by the memory/logic conjugate system shown in FIG. 14. In addition, as shown in FIG. 15 (B), a DSP (digital signal processor) having a DATA RAM 1, a DATA RAM 2, an adder, and a multiplier can be realized.

Although a case where a plurality of cluster memories on a same cluster memory chip belongs to different groups (a case where a plurality of cluster memories on a same cluster memory chip is not electrically interconnected) has been described above, it may be configured such that two or more cluster memories on a same cluster memory chip belong to a same group.

Figure 16:
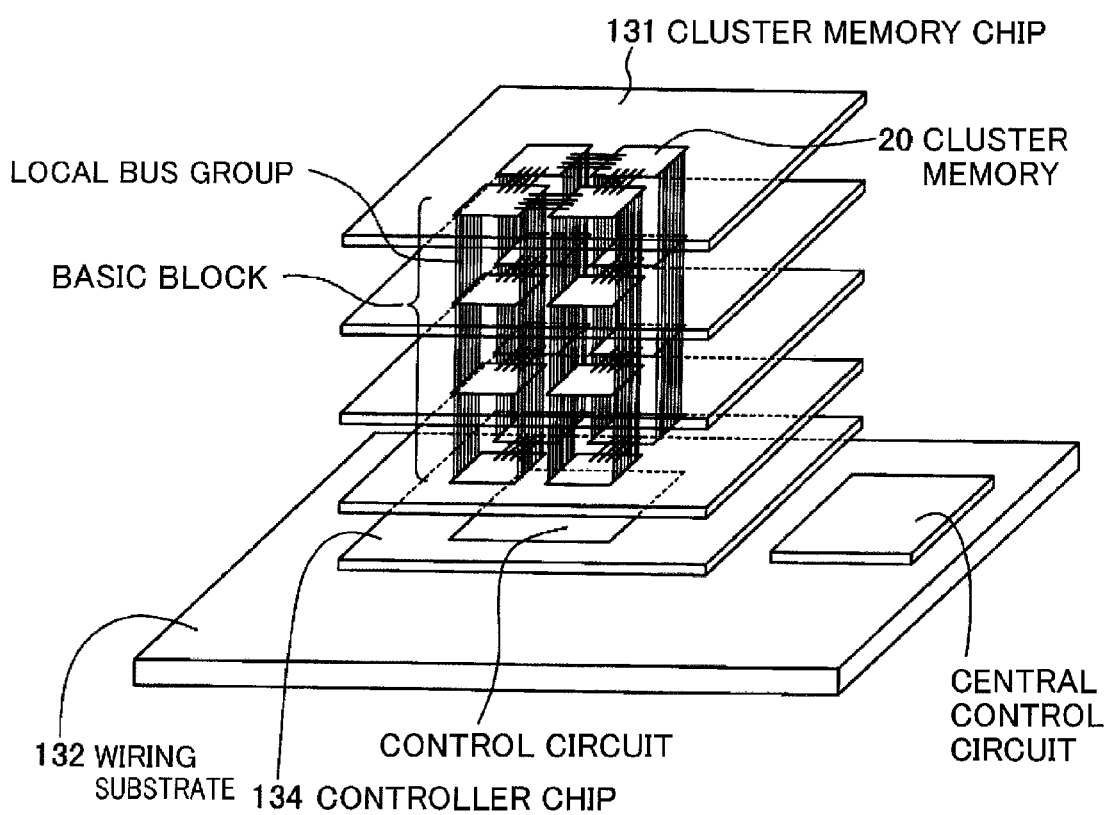
FIG. 16 illustrates the memory/logic conjugate system when a plurality of cluster memories on a same cluster memory chip belongs to a same group.

FIG. 16 illustrates the memory/logic conjugate system when a set (here, assumed to be four (2-column×2-row)) of cluster memories on a same cluster memory chip belongs to a same group. In this case, one set of cluster memories on each cluster memory chip is electrically interconnected, respectively using a wiring layer of the corresponding cluster memory chip. In addition, a plurality of sets located along the stacking direction (Z-direction) of the cluster memory chips is electrically interconnected and also connected to the control circuit (PU) by corresponding local buses including through silicon vias, respectively. In this manner, the memory and logic configuration can be effectively expanded.

Figure 17:
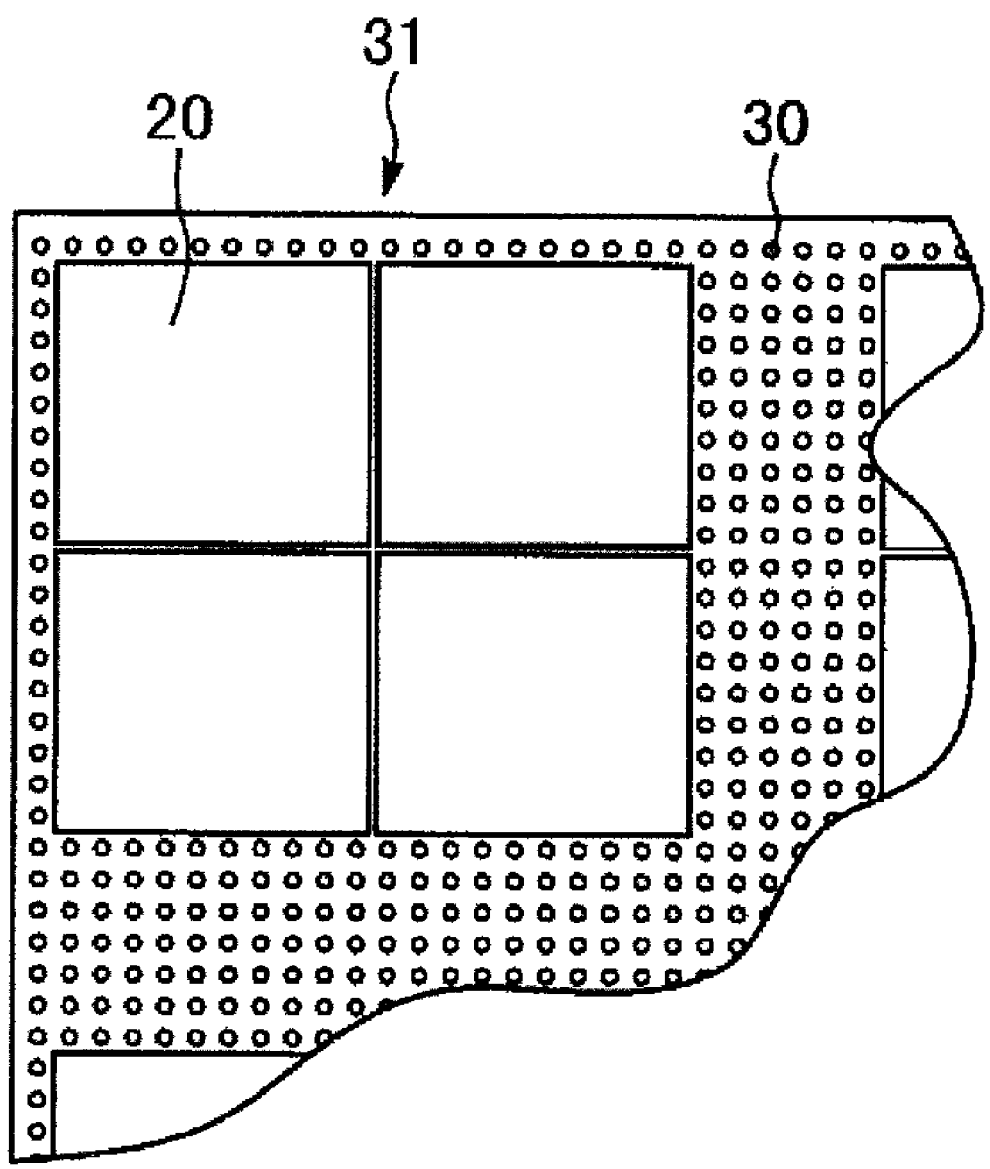
FIG. 17 is a plan view illustrating a cluster memory chip shown in FIG. 16.

FIG. 17 is a schematic plan view illustrating an enlarged part of a semiconductor chip (cluster memory chip) having the cluster memory shown in FIG. 16 arranged therein.

As shown in FIG. 17, the cluster memory chip 31 with a thickness of about 50 µm has a plurality of cluster memories 20. The cluster memory chip 31 has a plurality of sets of four (2×2) rectangular planar-shaped cluster memories 20 collectively arranged therein, where 2×2 cluster memories 20 form a set. In addition, a plurality of through silicon vias 30 located on the periphery of the four cluster memories is provided in the cluster memory chip 31, with inter-connection pads attached to both ends of the through silicon vias 30.

Since the system performance depends on how good the communication between clusters (between cluster memories) is, description is first given thereof. In practice, a 500 MHz level is preferred. The length that allows direct exchange of signals between clusters without using a repeater or a buffer is about 5 mm (at 500 MHz). It is estimated to be around 450 µm×450 µm when creating the cluster memory 20 of FIG. 1A by a process of a 0.18 µm node. Assuming a required footprint of 600 µm×600 µm including wiring and TSV, the planar configuration becomes 8×8=64 clusters. Let us consider a 10-chip TSV connection shown in FIG. 11, with the 8×8 configuration constituting a chip. Assuming that the diameter of TSV is 10 µm, the chip thickness must be about 50 µm due to limitation on the processing aspect ratio, and the chip interval 37 is about 50 µm. Therefore, the thickness of a 10-layer stacking is 1 mm. Direct communication between clusters can be performed with a wiring length of 5 mm, whereby a configuration of 640 clusters is completed. Regarding the 640 clusters as a block, although a plurality of blocks can be allocated on the wiring substrate 32 for further expansion, the length of wiring exceeds 5 mm and thus the communication requires a buffer. Therefore, the controller chip 34 is provided on the lowest block layer as shown in FIG. 11. Although the external bus can be realized by a total of 160 bus lines, i.e., 64 bits×2=128 bus lines for the address and data lines and the 32-bit control bus, the number of internal buses arranged on the periphery of the cluster of FIG. 17 is (8×8 (64 Bit)+32 Bit)×the number of chip stacks, which requires 960 bus lines assuming ten stacks. Assuming an equivalent number for the power source and grounding, about 2000 TSVs are necessary. A 10 μmφ TSV, having a footprint of 20 μm×20 μm, requires a total footprint of 0.8 mm² for the 2000 TSVs. Assuming that a 5 mm-square chip size can realize this configuration, the TSV footprint ratio is only 3.2%, manifesting the allowance of this configuration.

The bandwidth when communicating 500 MHz with 960 pins is 480 Gbps according to DDR, exhibiting a performance of 480 Gbps/128 bit=3.75 GIPS due to the one-to-one complete tight coupling between clusters.

The present invention is not limited to the above-mentioned embodiments and can be implemented in a variety of modifications within a range not deviating from the scope of the present invention. For example, in the above-mentioned embodiments, a plurality of cluster memory chips 31 having only cluster memories arranged on a single chip are formed, and the controller chip 34 having a control circuit (sub CPU) which controls each cluster memory of the plurality of cluster memory chips 31 and a central control circuit (main CPU) which controls and manages the plurality of cluster memory chips as a whole integrated on a single chip is formed. However, the control circuit and the central control circuit need not necessarily be integrated on a single chip, and the control circuit or the central control circuit may be formed on a cluster memory chip. In addition, the transistor constituting the memory/logic conjugate system may be a Field effect transistor (FET), a bipolar transistor, a Thin Film Transistor (TFT), or a combination thereof. In addition, the FET is not limited to a MIS (Metal-Insulator-Semiconductor) or a MOS (Metal Oxide Semiconductor).

Examples of the embodiment are provided as appendices.

APPENDIX 1

A memory/logic conjugate system comprising:
a first cluster memory including first basic cells arranged in a cluster, each of said first basic cells including a first memory circuit;
a first bus interface electrically coupled to said first cluster memory;
a second cluster memory including second basic cells arranged in a cluster, each of said second basic cells including a second memory circuit;
a second bus interface electrically coupled to said second cluster memory;
a first control circuit that controls said first and second cluster memories;
a first local bus electrically interconnecting said first control circuit and said first and second bus interfaces;
a third cluster memory including third basic cells arranged in a cluster, each of said third basic cells including a third memory circuit;
a third bus interface electrically coupled to said third cluster memory;
a fourth cluster memory including fourth basic cells arranged in a cluster, each of said fourth basic cells including a fourth memory circuit;
a fourth bus interface electrically coupled to said fourth cluster memory;
a second control circuit that controls said third and fourth cluster memories;
a second local bus electrically interconnecting said second control circuit and said third and fourth bus interfaces;
a global bus electrically coupling said first control circuit and said second control circuit; and
a central control circuit electrically coupled to said global bus to control and manage said first to fourth cluster memories as a whole, wherein
an arbitrary one of said first to fourth basic cells is directly accessed through said first local bus or said second local bus so that truth value data is written therein, and whereby said arbitrary basic cell is switched to a logic circuit as conjugate.

APPENDIX 2

The memory/logic conjugate system of appendix 1, wherein said first and third cluster memories and said first and third bus interfaces are formed on a first cluster memory chip,
said second and fourth cluster memories and said second and fourth bus interfaces are formed on said second cluster memory chip,
said first local bus includes a first through-via formed on said first cluster memory chip and a second through-via formed on said second cluster memory chip, and
said second local bus includes a third through-via formed on said first cluster memory chip and a fourth through-via formed on said second cluster memory chip.

APPENDIX 3

The memory/logic conjugate system of appendix 2, wherein said central control circuit, said first and second control circuits, and said global bus are formed on a controller chip, and
said controller chip, said first and second cluster memory chips are formed by stacking.

DESCRIPTION OF REFERENCE NUMERALS

10: basic cell, 11: multibus, 12: bus interface, 13: decoder, 14: control circuit, 16: memory address, 17: expanded address (generation of CEX and CEY), 18: SRAM, 19: basic cell array, 20: cluster memory, 21: path setting register, 22: input control circuit, 23: output control circuit, 30: through silicon via, 31, 131: cluster memory chip, 32, 132: wiring substrate, 34, 134: controller chip, 37: chip interval

The invention claimed is:
1. A memory/logic conjugate system comprising:
a memory circuit including a plurality of memory bits;
an internal bus coupled to said memory circuit;
a basic cell including said memory circuit and said internal bus;
a cluster memory including a plurality of said basic cells arranged in a cluster;
a plurality of cluster memory chips each including said cluster memory;
a through-via electrically interconnecting said plurality of cluster memory chips in a viewpoint of multilayer;
a multibus including said through-via; and
a controller that controls said plurality of cluster memories, wherein
said controller directly accesses an arbitrary one of said basic cells through said multibus and writes truth value data into said memory circuit via said internal bus, thereby said controller switches said arbitrary basic cell to a logic circuit as conjugate.
2. The memory/logic conjugate system according to claim 1, wherein each of said plurality of cluster memory chips includes a plurality of said cluster memories and further com- prises a wiring that electrically couples said plurality of cluster memories in a viewpoint of a surface of said cluster memory chip.

3. The memory/logic conjugate system according to claim 1, further comprising a controller chip including said controller, wherein said controller chip electrically couples to said cluster memory chip via said through-via in a viewpoint of multilayer.

4. The memory/logic conjugate system according to claim 1, wherein said basic cell includes a path setting register and a switch, said path setting register and said switch controls a connection of said internal bus.

5. The memory/logic conjugate system according to claim 1, wherein said basic cell includes:
said memory circuit;
said internal bus coupled to said memory circuit; and
further includes a path setting unit that controls a connection of said internal bus.

6. The memory/logic conjugate system according to claim 5, wherein said path setting unit includes a switch, a path setting register that controls said switch, and a mode selector.

7. A memory/logic conjugate system comprising:
a plurality of cluster memory chips each comprising a plurality of cluster memories each including a plurality of basic cells arranged in a cluster, each of said basic cells including a memory circuit and an internal bus coupled to said memory circuit;
a controller chip that controls said plurality of cluster memories; and
a plurality of through-vias electrically coupling said plurality of cluster memory chips and said controller chip in a stacking direction, wherein
said plurality of cluster memories included in each of said plurality of cluster memory chips is electrically coupled to said controller chip via a multibus including said plurality of through-vias, and
said controller chip directly accesses an arbitrary one of said basic cells through said multibus and writes truth value data via said internal bus, thereby said controller chip switches said arbitrary basic cell to a logic circuit as conjugate.

8. The memory/logic conjugate system according to claim 7, wherein two or more of said plurality of cluster memories, in each of said plurality of cluster memory chips, are electrically interconnected using a wiring layer included in said cluster memory chip.

9. The memory/logic conjugate system according to claim 7, wherein
said controller chip includes a plurality of control circuits, and
each of said plurality of control circuits controls said plurality of cluster memories connected via said plurality of through-vias corresponding thereto, respectively.

10. The memory/logic conjugate system according to claim 7, wherein said basic cell includes a path setting register and a switch, which controls a connection of said internal bus.

11. The memory/logic conjugate system according to claim 7, wherein at least a plurality of memory bits constitutes said memory circuit.

12. The memory/logic conjugate system according to claim 7, wherein said basic cell includes:
said memory circuit;
said internal bus coupled to said memory circuit; and
further includes a path setting unit that controls a connection of said internal bus.

13. The memory/logic conjugate system according to claim 12, wherein said path setting unit includes a switch, a path setting register that controls said switch, and a mode selector.

14. The memory/logic conjugate system according to claim 12, further comprising a first control signal, wherein
said first control signal is supplied to said memory circuit through said multibus and said internal bus,
said basic cell is switched to a forced memory mode (A) when said first control signal is at a predetermined first level, and
said basic cell is switched to a system mode (B) when said first control signal is at a predetermined second level that is different from said first level.

15. The memory/logic conjugate system according to claim 14, wherein
in said forced memory mode (A), said memory circuit becomes directly controllable from said multibus by inputting an address signal, a data input signal, and a control signal from said multibus to an input terminal of said memory circuit.

16. The memory/logic conjugate system according to claim 15, wherein
in said system mode (B), said address signal, said data input signal, and said control signal in said forced memory mode (A) are blocked, and a signal that inputs to said logic circuit is controlled by said path setting unit,
said system mode (B) includes a memory mode (B-1) and a logic mode (B-2),
said memory mode (B-1) includes an external memory mode (B-1-1) and a path setting register write mode (B-1-2), and
said logic mode (B-2) includes at least one of a computation mode (B-2-1), a combined circuit mode (B-2-2), an internal memory mode (B-2-3) which is a memory invisible from outside, a logic Lib mode (B-2-4), and a path setting register information change mode (B-2-5).

17. A memory/logic conjugate system comprising:
a first cluster memory including a first basic cells arranged in a cluster, each of said first basic cells including a first memory circuit and a first internal bus connected to said first memory circuit;
a first bus interface electrically coupled to said first cluster memory;
a first cluster memory chip including said first cluster memory and said first bus interface formed therein;
a first through-via formed in said first cluster memory chip and electrically coupled to said first bus interface;
a second cluster memory including a second basic cells arranged in a cluster, each of said second basic cells including a second memory circuit and a second internal bus coupled to said second memory circuit;
a second bus interface electrically coupled to said second cluster memory;
a second cluster memory chip including said second cluster memory and said second bus interface formed therein; and
a second through-via formed in said second cluster memory chip and electrically coupled to said second bus interface, wherein
said first cluster memory chip is stacked on said second cluster memory chip,
said first through-via is electrically coupled to said second through-via, and
an arbitrary one of said first and second basic cells is directly accessed through said first and second through-vias and said first and second bus interfaces so that truth value data is written therein via corresponding said first or second internal buses, and whereby said arbitrary basic cell is switched to a logic circuit as conjugate.

18. The memory/logic conjugate system according to claim 17, wherein said first and second basic cells includes a first and a second path setting registers and a first and a second switches, which controls a connection of said first and second internal buses corresponding thereto, respectively.

19. The memory/logic conjugate system according to claim 17, wherein said first and second basic cells includes:
   said first and second memory circuits corresponding thereto, respectively;
   said first and second internal buses connected to said first and second memory circuits, respectively; and
   further includes a first and a second path setting unit that controls a connection of said first and second internal buses, respectively.

20. The memory/logic conjugate system according to claim 19, wherein said first and second path setting units includes a first and a second switches, a first and a second path setting registers that controls said first and second switches, and a first and a second mode selectors, respectively.

* * * * *